United States Patent
En et al.

(10) Patent No.: US 12,020,894 B2
(45) Date of Patent: Jun. 25, 2024

(54) BEAM ADJUSTMENT METHOD AND THREE-DIMENSIONAL POWDER BED FUSION ADDITIVE MANUFACTURING APPARATUS

(71) Applicant: JEOL Ltd., Tokyo (JP)

(72) Inventors: Shio En, Tokyo (JP); Takashi Sato, Tokyo (JP)

(73) Assignee: JEOL Ltd., Tokyo (JP)

( * ) Notice: Subject to any disclaimer, the term of this patent is extended or adjusted under 35 U.S.C. 154(b) by 304 days.

(21) Appl. No.: 17/324,301

(22) Filed: May 19, 2021

(65) Prior Publication Data

US 2021/0407760 A1 Dec. 30, 2021

(30) Foreign Application Priority Data

May 20, 2020 (JP) ................................. 2020-088419

(51) Int. Cl.
*H01J 37/147* (2006.01)
*B22F 10/80* (2021.01)
(Continued)

(52) U.S. Cl.
CPC .......... *H01J 37/1474* (2013.01); *B22F 10/80* (2021.01); *B22F 12/41* (2021.01);
(Continued)

(58) Field of Classification Search
CPC ....... H01J 37/1474; H01J 37/09; B33Y 30/00; B33Y 50/00; B33Y 50/02; B22F 12/41;
(Continued)

(56) References Cited

U.S. PATENT DOCUMENTS

2004/0069952 A1* 4/2004 Katsumura ............. H01J 37/28
 250/397
2005/0040343 A1 2/2005 Sohda et al.
(Continued)

FOREIGN PATENT DOCUMENTS

| EP | 3065161 A1 | 9/2016 |
| JP | 5468149 A | 6/1979 |
| JP | 200564041 A | 3/2005 |

OTHER PUBLICATIONS

Extended European Search Report issued in EP21174045.1 on Oct. 19, 2021.
Office Action issued in JP2020088419 on Jul. 26, 2022.

*Primary Examiner* — Nathaniel E Wiehe
*Assistant Examiner* — Dilnessa B Belay
(74) *Attorney, Agent, or Firm* — The Webb Law Firm

(57) ABSTRACT

A beam adjustment method includes: installing, on an irradiation surface to which an electron beam is radiated, a detection part having a Faraday cup catching electrical charges of the electron beam, and installing, on a side of an electron gun further than the detection part, a shielding plate having opening holes through which the electron beam is passable. The method includes causing, upon performing beam diameter measurement processing, the electron beam to pass through the opening holes, and radiating the electron beam to the Faraday cup. In addition, the method includes radiating, upon performing normal processing, the electron beam to the shielding plate.

10 Claims, 15 Drawing Sheets

(51) Int. Cl.
  *B22F 12/41* (2021.01)
  *B23K 15/00* (2006.01)
  *B23K 15/02* (2006.01)
  *B33Y 30/00* (2015.01)
  *B33Y 50/00* (2015.01)
  *H01J 37/09* (2006.01)

(52) U.S. Cl.
  CPC ........ *B23K 15/002* (2013.01); *B23K 15/0086* (2013.01); *B23K 15/02* (2013.01); *B33Y 30/00* (2014.12); *B33Y 50/00* (2014.12); *H01J 37/09* (2013.01)

(58) Field of Classification Search
  CPC ... B22F 10/80; B23K 15/002; B23K 15/0086; B23K 15/02
  See application file for complete search history.

(56) References Cited

U.S. PATENT DOCUMENTS

| | | |
|---|---|---|
| 2006/0038139 A1 | 2/2006 | Elmer et al. |
| 2010/0224789 A1* | 9/2010 | Sakai ................. H01J 37/1471 250/397 |
| 2017/0154750 A1 | 6/2017 | Sato |

* cited by examiner

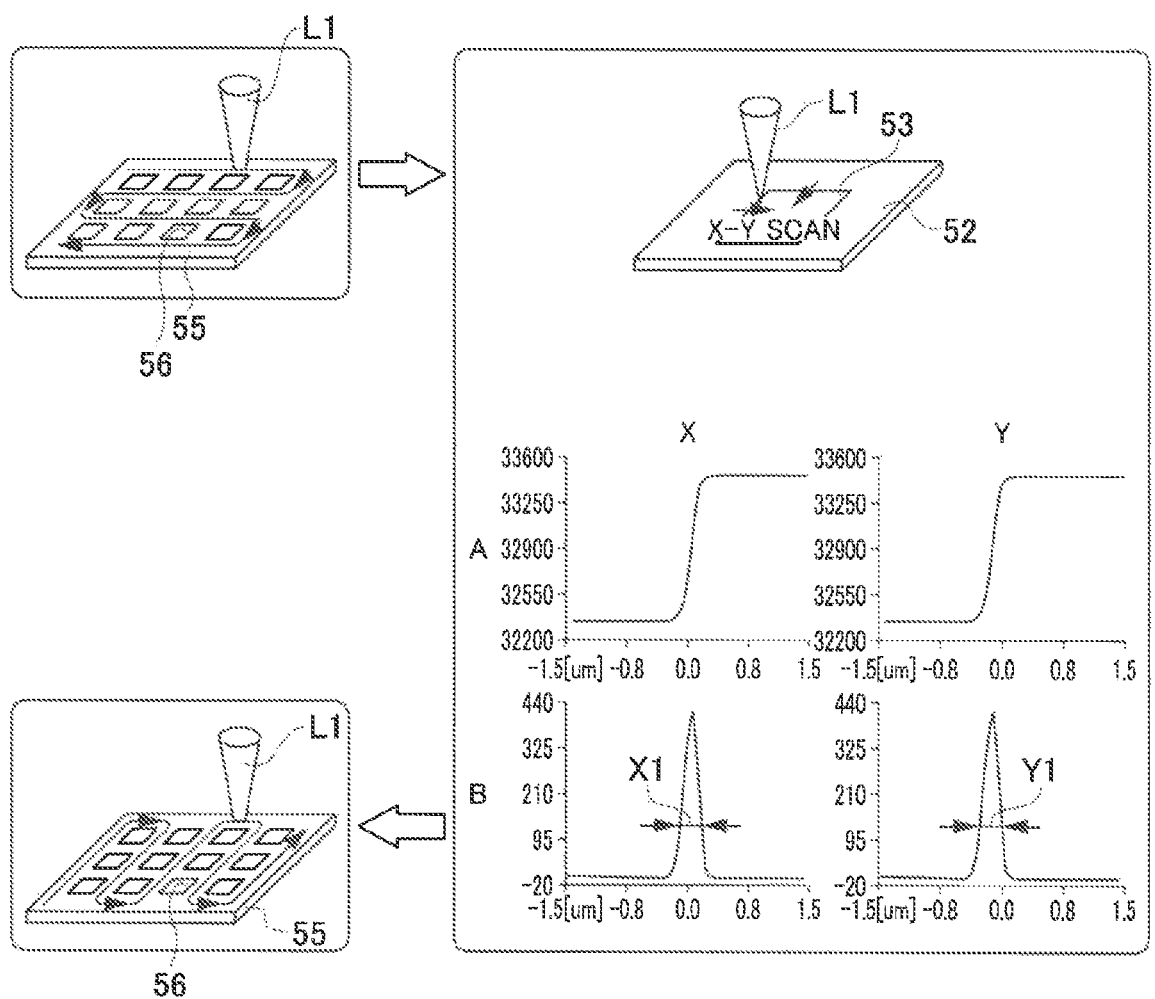

FIG. 7
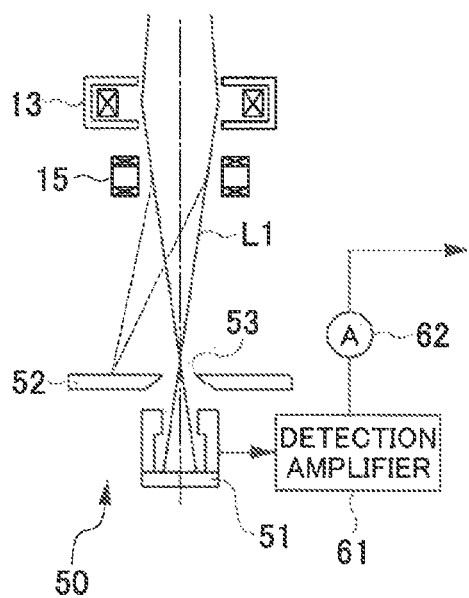
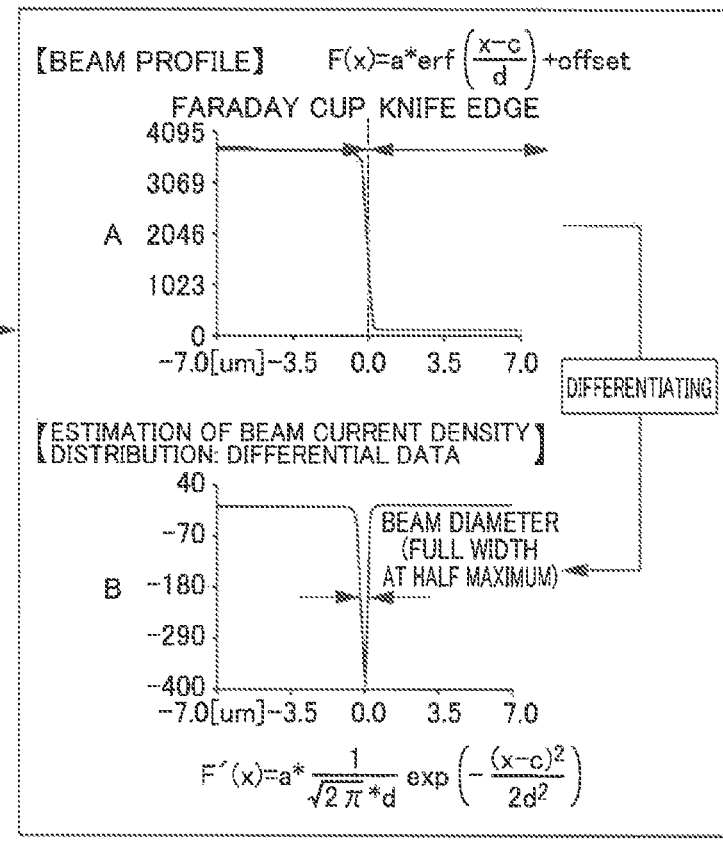

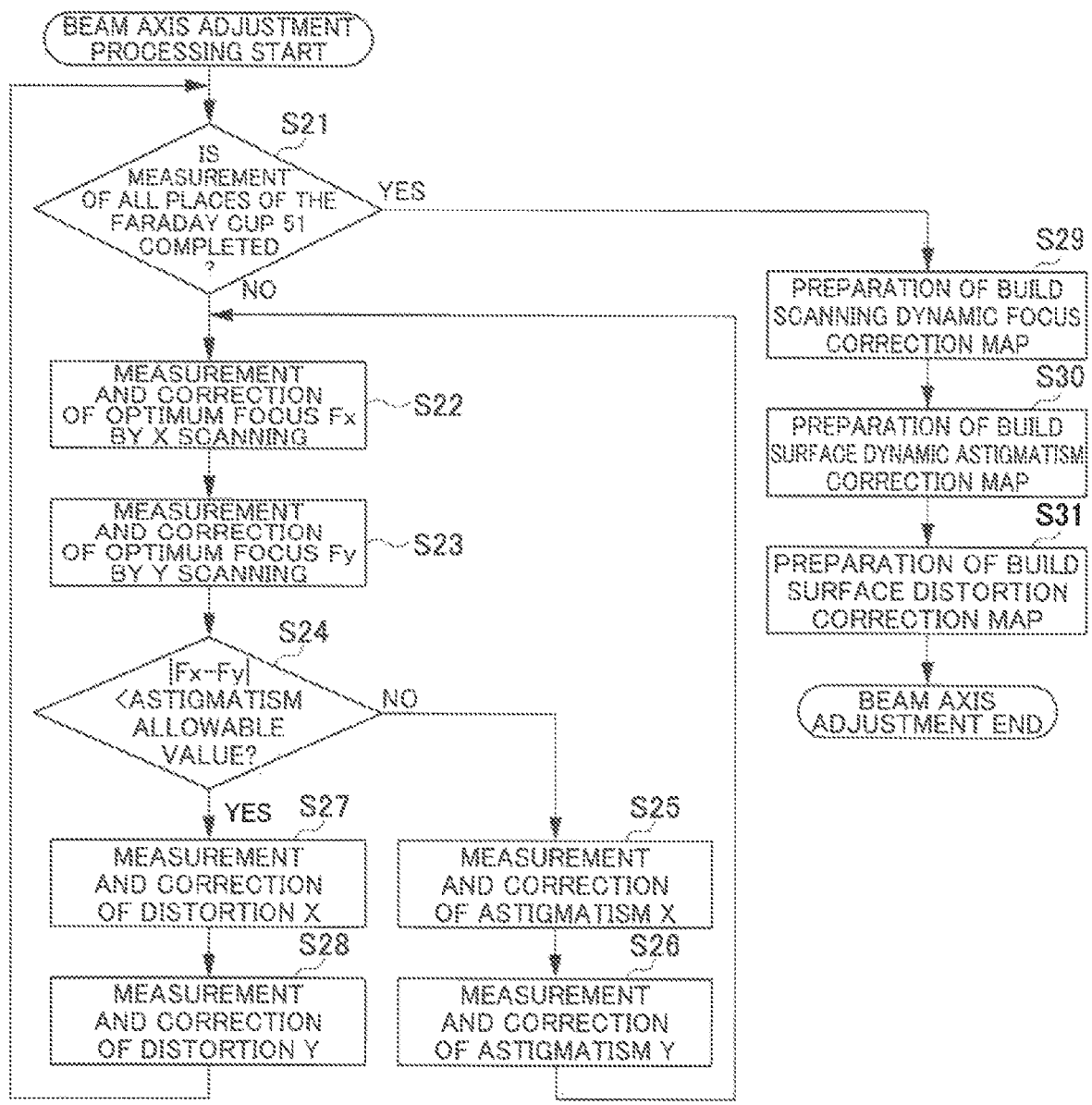

FIG. 11A
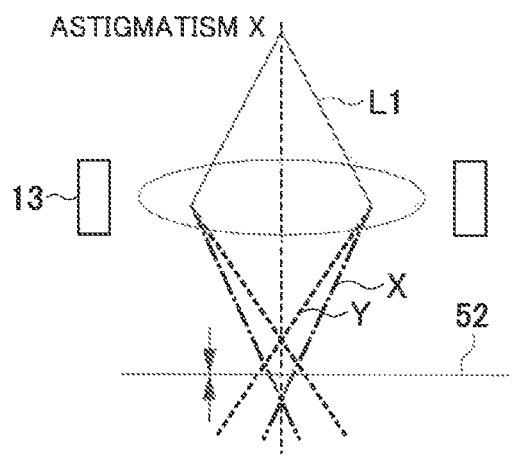
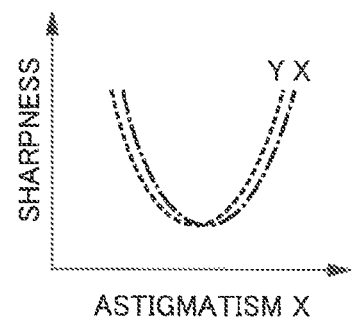
FIG. 11B
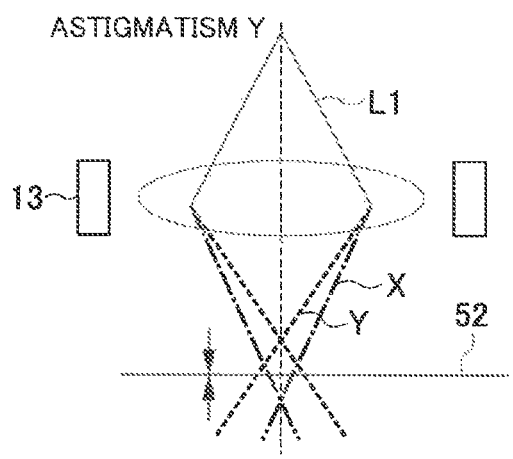
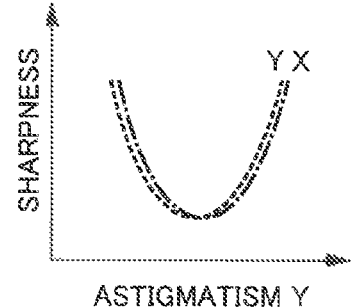

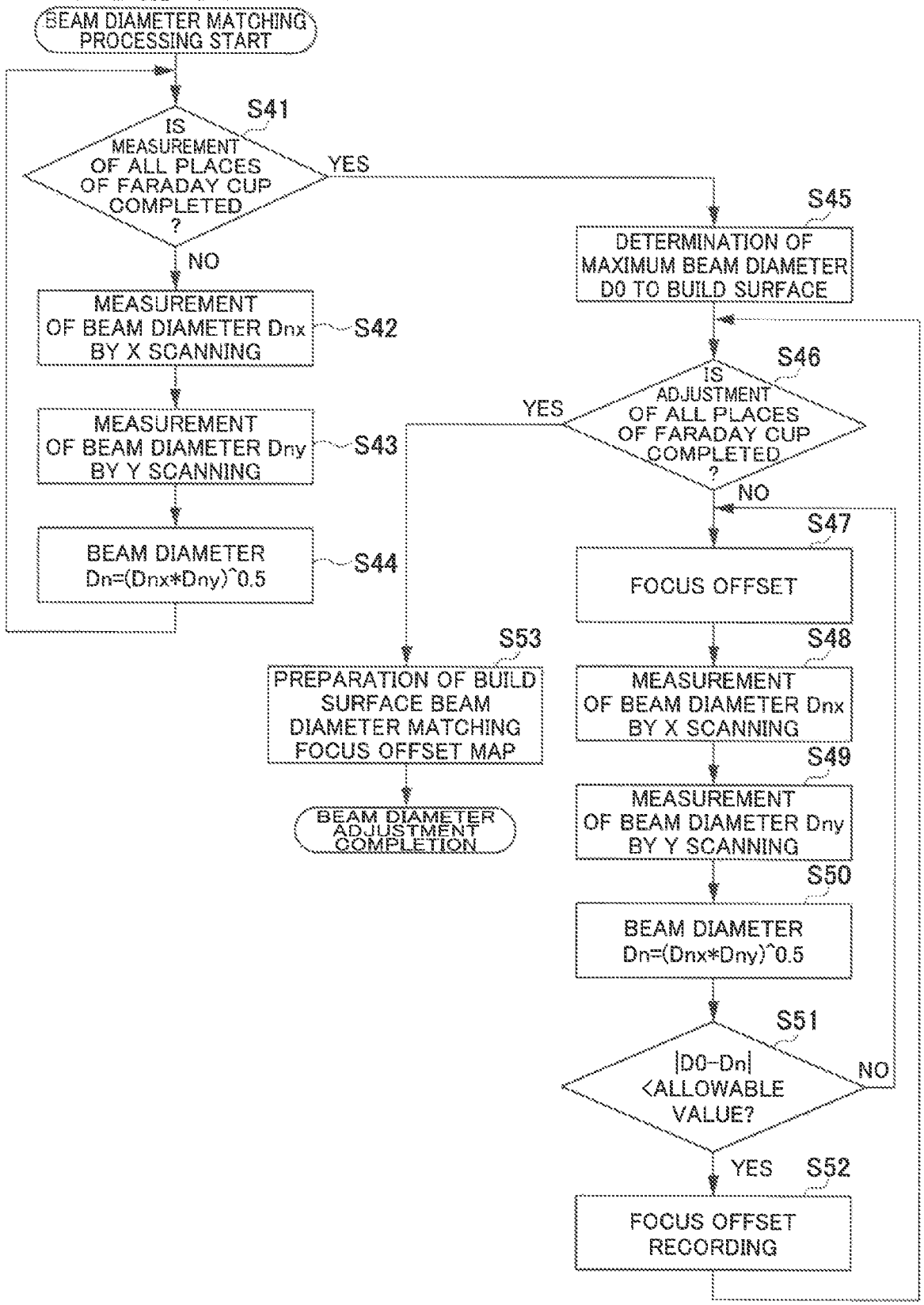

BEAM ADJUSTMENT METHOD AND THREE-DIMENSIONAL POWDER BED FUSION ADDITIVE MANUFACTURING APPARATUS

CROSS-REFERENCE TO RELATED APPLICATION

This application claims priority to Japanese Patent Application No. 2020-088419 filed May 20, 2020, the disclosure of which is hereby incorporated by reference in its entirety.

BACKGROUND OF THE INVENTION

Field of the Invention

The present invention relates to a beam adjustment method for adjusting an electron beam and a three-dimensional powder bed fusion additive manufacturing (PBF-AM) apparatus for modeling by superposing thinly bedded layers of a powder material one by one on a stage.

Description of Related Art

In an apparatus which radiates an electron beam, work for adjusting a beam diameter and an irradiation position of the electron beam is performed. As such a technology for adjusting the electron beam, for example, there is a technology disclosed in JP 54-68149 A. In JP 54-68149 A, the technology which irradiates a Faraday cup catching electrical charges of the electron beam is disclosed.

In addition, in recent years, there has been known a three-dimensional PBF-AM apparatus, which models a solid object by irradiating each powder layer constituted of a powder material bedded on a stage, for example, with an electron beam to melt the powder material and stacking solidified layers of this powder material.

SUMMARY OF THE INVENTION

However, in the three-dimensional PBF-AM apparatus, in order to melt the powder material, an electron beam whose intensity is comparatively high is used. Therefore, in the technology disclosed in JP 54-68149 A, a temperature of the Faraday cup is increased by the electron beam, positions of passing holes provided for a knife edge of the Faraday cup are changed, and accurate adjustment of the electron beam cannot be performed.

In view of the above-mentioned problem, an object of the present invention is to provide a beam adjustment method which allows accurate adjustment of an electron beam and a three-dimensional PBF-AM apparatus.

In order to solve the above-mentioned problem and to achieve the object of the present invention, a beam adjustment method of the present invention is a beam adjustment method for an electron beam radiated from an electron gun. The beam adjustment method includes: installing, on an irradiation surface to which the electron beam is radiated, a detection part having a Faraday cup catching electrical charges of the electron beam, and installing, on a side of the electron gun further than the detection part, a shielding plate having opening holes through which the electron beam is passable. The method further includes: causing, upon performing beam diameter measurement processing in which a beam diameter of the electron beam is measured, the electron beam to pass through the opening holes provided for the shielding plate, and radiating the electron beam to the Faraday cup. In addition, the method includes radiating, upon performing normal processing in which the beam diameter of the electron beam is not measured, the electron beam to the shielding plate.

In addition, a three-dimensional powder bed fusion additive manufacturing (PBF-AM) apparatus includes a stage on which powder layers constituted of a powder material are bedded; an electron gun which radiates an electron beam toward a build surface of the stage; and an adjustment unit which is installed to the stage in an attachable and detachable manner upon adjusting the electron beam.

The adjustment unit includes a detection part which is placed on the stage and a shielding plate which is installed on a side of the electron gun further than the detection part and has opening holes through which the electron beam is passable.

The detection part includes a Faraday cup which catches electrical charges of the electron beam and a knife edge which covers an opening of the Faraday cup and has passing holes through which the electron beam is passable. The shielding plate shields the electron beam upon performing normal processing in which a beam diameter of the electron beam is not measured.

In addition, another beam adjustment method of the present invention is a beam adjustment method for an electron beam radiated from an electron gun. The method includes: installing, on an irradiation surface to which the electron beam is radiated, a detection part catching electrical charges of the electron beam. The method further includes: performing, upon performing beam diameter measurement processing in which a beam diameter of the electron beam is measured, scanning on the detection part, and measuring the beam diameter of the electron beam. In addition, the method includes: performing, upon performing normal processing in which the beam diameter of the electron beam is not measured, scanning with the electron beam on the detection part at a higher speed than a speed at which the electron beam is scanned upon performing the beam diameter measurement processing.

By the beam adjustment method and the three-dimensional PBF-AM apparatus of the present invention, accurate adjustment of the electron beam can be performed.

BRIEF DESCRIPTION OF DRAWINGS

FIG. 5 is an explanatory diagram showing the beam adjustment work in the three-dimensional PBF-AM apparatus according to the first embodiment of the present invention;

FIGS. 7A and 7B are explanatory diagrams explaining a method of measuring a beam diameter in the three-dimensional PBF-AM apparatus according to the first embodiment of the present invention, FIG. 7A is a graph showing a current value, and FIG. 7B shows differential data in FIG. 7A;

FIG. 8 is a flowchart showing beam axis adjustment processing in the three-dimensional PBF-AM apparatus according to the first embodiment of the present invention;

FIG. 9A is an explanatory diagram showing an electron beam radiated to a detection part and FIG. 9B is a graph showing relationship between a beam diameter and an excitation current of an objective lens;

FIG. 10A is an explanatory diagram showing an electron beam radiated to the detection part and FIG. 10B is a graph showing relationship between the beam diameter and the excitation current of the objective lens;

FIGS. 11A and 11B show astigmatism correction processing in the three-dimensional PBF-AM apparatus according to the first embodiment of the present invention, FIG. 11A shows measurement and correction processing of astigmatism X in the first direction, and FIG. 11B shows measurement and correction processing of astigmatism Y in the second direction;

FIG. 12A shows the state before the correction, and FIG. 12B shows the state after the correction;

FIG. 14A shows the map before the correction, and FIG. 14B shows the map after the correction;

FIG. 15 is a flowchart showing beam diameter matching processing in the three-dimensional PBF-AM apparatus according to the first embodiment of the present invention.

DESCRIPTION OF THE INVENTION

Figure 1:
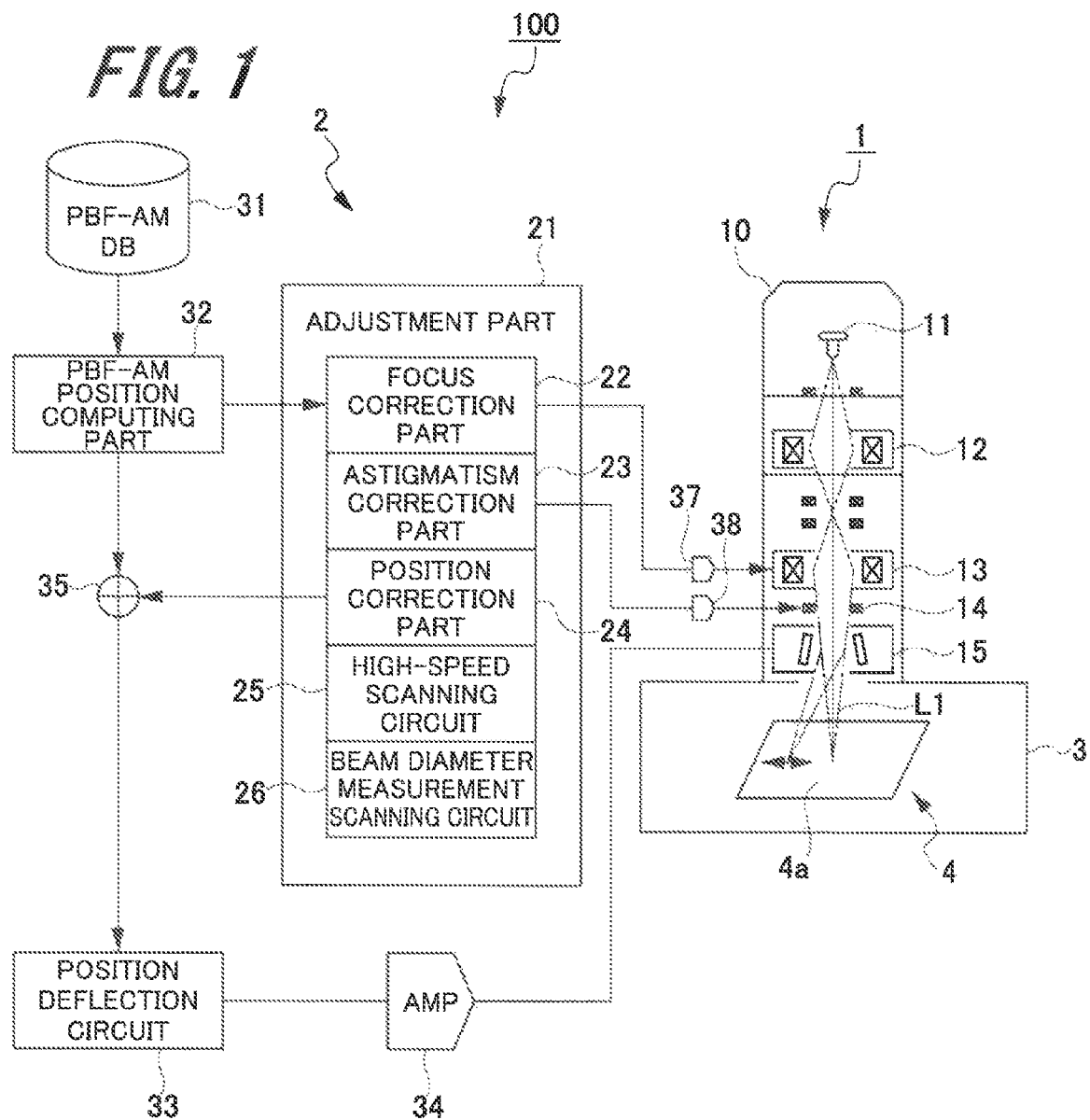
FIG. 1 is a schematic configuration diagram illustrating a three-dimensional powder bed fusion additive manufacturing (PBF-AM) apparatus according to a first embodiment of the present invention.

Hereinafter, embodiments of a beam adjustment method and a three-dimensional powder bed fusion additive manufacturing (PBF-AM) apparatus of the present invention will be described with reference to the FIGS. 1 to 16. Note that in the drawings, common members are denoted by the same reference signs.

1. First Embodiment 1-1. Configuration of Three-Dimensional PBF-AM Apparatus

First, a three-dimensional PBF-AM apparatus according to a first embodiment (hereinafter, referred to as "the present embodiment") of the present invention will be described with reference to FIG. 1.

FIG. 1 is an explanatory diagram schematically illustrating the three-dimensional PBF-AM apparatus of the present embodiment.

The apparatus illustrated in FIG. 1 is a three-dimensional PBF-AM apparatus which irradiates, for example, a powder material made of metal such as titanium, aluminum, and iron with an electron beam to melt the powder material and stacks images of the solidified powder material, thereby modeling a solid object.

As illustrated in FIG. 1, the three-dimensional PBF-AM apparatus 100 has an irradiation unit 1 which radiates an electron beam L1, a control part 2 which controls the irradiation unit 1, and a build chamber 3. Inside the build chamber 3, a build unit 4 is installed. In addition, upon performing adjustment work for the electron beam L1, an adjustment unit 70 is provided for the build unit 4 in an attachable and detachable manner.

The irradiation unit 1 has an electron gun 11 which radiates the electron beam L1, a focusing lens 12, an objective lens 13, a coil 14 for astigmatism correction, and a deflection amplifier 15. The electron gun 11 as one example of an irradiation gun has a three-pole configuration which includes an emitter, an extraction electrode, and an acceleration electrode. The emitter and the acceleration electrode are connected to an acceleration power source. In addition, the extraction electrode is connected to an extraction potential generation part that is not illustrated. When an extraction potential is applied from the extraction potential generation part to the extraction electrode, the extraction electrode extracts an electronic device from the emitter. The acceleration electrode accelerates electrons discharged from the emitter by an acceleration potential applied by the acceleration power source and directs the electrons toward the focusing lens 12, the objective lens 13, and the like as the electron beam L1.

The focusing lens 12 focuses the electron beam L1 radiated from the electron gun 11. The electron beam L1 which has passed through the focusing lens 12 enters the objective lens 13. The objective lens 13 focuses the electron beam L1 so as to have a predetermined beam diameter on the build surface 4a. In the objective lens 13, the beam diameter is adjusted by the later-described adjustment part 21. The coil 14 is controlled by the later-described adjustment part 21 and performs astigmatism correction of the electron beam L1. The deflection amplifier 15 is controlled by a position deflection circuit 33 of the later-described control part 2 and deflects the electron beam L1 to a predetermined position of the build surface 4a.

Figure 2:
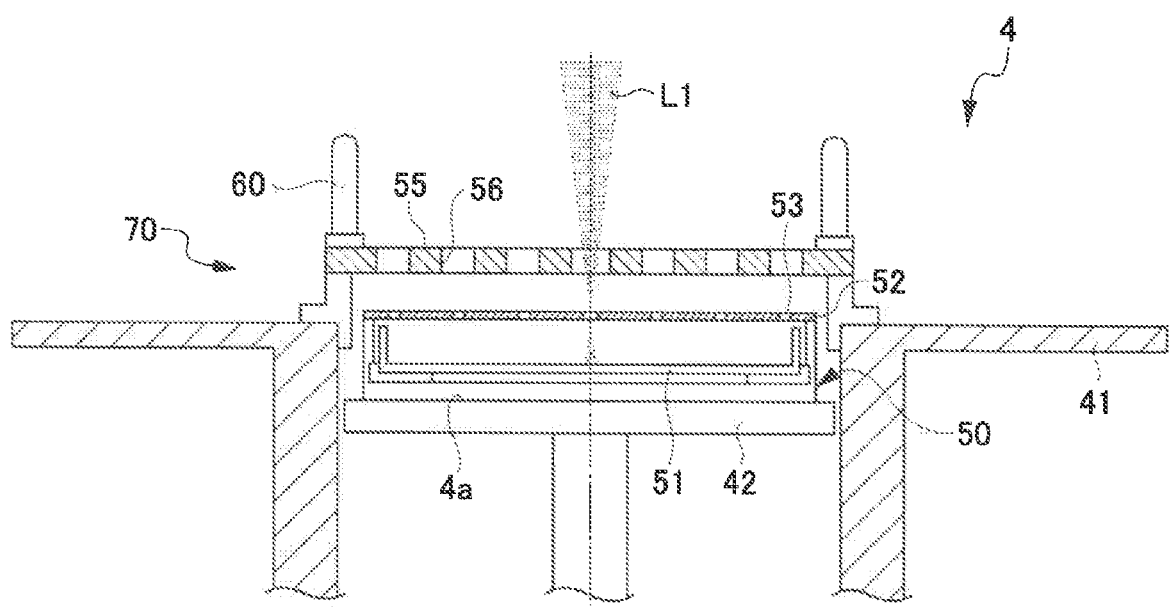
FIG. 2 is a cross-sectional view illustrating a schematic configuration of a build unit and an adjustment unit of the three-dimensional PBF-AM apparatus according to the first embodiment of the present invention.

The control part 2 has the adjustment part 21 which adjusts the irradiation unit 1, a powder bed fusion additive manufacturing (PBF-AM) DB 31, a powder bed fusion additive manufacturing (PBF-AM) position computing part 32, a position deflection circuit 33, AMPs 34, 37, and 38, and a changeover switch 35 (see FIG. 2). In the PBF-AM DB 31, information pertinent to a modeled object built by the three-dimensional PBF-AM apparatus 100 is stored. The PBF-AM position computing part 32 acquires the information pertinent to the modeled object from the PBF-AM DB 31 and computes a position where the powder material stacked in the build unit 4 is irradiated with the beam. The PBF-AM position computing part 32 outputs the computed irradiation position information to the position deflection circuit 33.

The position deflection circuit 33 is connected to the irradiation unit 1 via the AMP 34. The position deflection circuit 33 controls the irradiation unit 1 based on the irradiation position information outputted from the PBF-AM position computing part 32 and the adjustment part 21. Thus, the irradiation unit 1 radiates the electron beam L1 to the predetermined position on the build surface 4a of the build unit 4.

The adjustment part 21 is connected to the irradiation unit 1. The adjustment part 21 has a focus correction part 22, an astigmatism correction part 23, a position correction part 24, a high-speed scanning circuit 25, and a beam diameter measurement scanning circuit 26. The focus correction part 22 corrects a focus of the electron beam L1 radiated from the irradiation unit 1, and the astigmatism correction part 23 corrects astigmatism of the electron beam L1. The focus correction part 22 is connected to the objective lens 13 via the AMP 37. The astigmatism correction part 23 is connected to the coil 14 for the astigmatism correction via the AMP 38.

In addition, the position correction part 24 corrects an irradiation position of the electron beam L1 radiated to the build surface 4a as one example of an irradiation surface. Upon performing the adjustment work for the electron beam L1, the high-speed scanning circuit 25 and the beam diameter measurement scanning circuit 26 set a position where the electron beam L1 is scanned. Note that detailed operation and configuration of the adjustment part 21 will be described later.

FIG. 2 is a cross-sectional view illustrating a schematic configuration of the build unit 4 and the adjustment unit 70.

As illustrated in FIG. 2, the build unit 4 has a build box 41 and a stage 42. In the build box 41, a cylindrical opening is formed. An axis direction of the opening extends along a light axis of the electron beam L1. The stage 42 is located in the opening of the build box 41. The stage 42 is supported in such a way as to be movable along the axis direction of the opening. A surface which faces the irradiation unit 1 in the stage 42 constitutes the build surface 4a on which the powder material is stacked.

Upon performing the adjustment work for the electron beam L1, on the stage 42, the adjustment unit 70 is located. The adjustment unit 70 has a detection part 50 which measures a current value of the electron beam L1, a shielding plate 55, and a supporting member 60.

The detection part 50 is placed on the build surface 4a of the stage 42. The detection part 50 has a Faraday cup 51 and a knife edge 52. One surface of the Faraday cup 51, which faces the irradiation unit 1, is open. The Faraday cup 51 catches electrical charges of the radiated electron beam L1. A current value measurement part 62 is connected to this Faraday cup 51 via a detection amplifier 61. The current value measurement part 62 measures a current value of the Faraday cup 51.

The knife edge 52 is located in such a way as to cover an opening of the Faraday cup 51. In the knife edge 52, a plurality of passing holes 53 through which the electron beam L1 is passable are formed. The plurality of passing holes 53 are formed in a lattice-like manner in a first direction X and a second direction Y which are orthogonal to the light axis of the electron beam L1 (see FIGS. 6A and 6B). Note that the first direction X and the second direction Y are orthogonal to each other. Each of the passing holes 53 has two sides which are in parallel with the first direction X and two sides which are in parallel with the second direction Y and is open in a rectangular manner. The electron beam L1 which has passed through the passing holes 53 of the knife edge 52 is radiated to the Faraday cup 51.

On a side of the irradiation unit 1 in the detection part 50, the shielding plate 55 is located in such a way as to be supported by the supporting member 60. The supporting member 60 is attached to the build box 41. The shielding plate 55 is formed in a substantially flat plate-like manner. The shielding plate 55 is located in such a way as to be spaced apart from the detection part 50.

In addition, in the shielding plate 55, a plurality of opening holes 56 are formed. The opening holes 56 are formed in positions facing the passing holes 53 provided for the knife edge 52. A size of an opening of each of the opening holes 56 is set to be larger than a size of an opening of each of the passing hole 53. In addition, upon beam diameter measurement scanning, the electron beam L1 passes through the opening holes 56 of the shielding plate 55. Each of the opening holes 56 is formed in a size which does not interfere with the electron beam L1 upon the beam diameter measurement scanning.

Next, the high-speed scanning circuit 25 and the beam diameter measurement scanning circuit 26 will be described with reference to FIG. 3.

Figure 3:
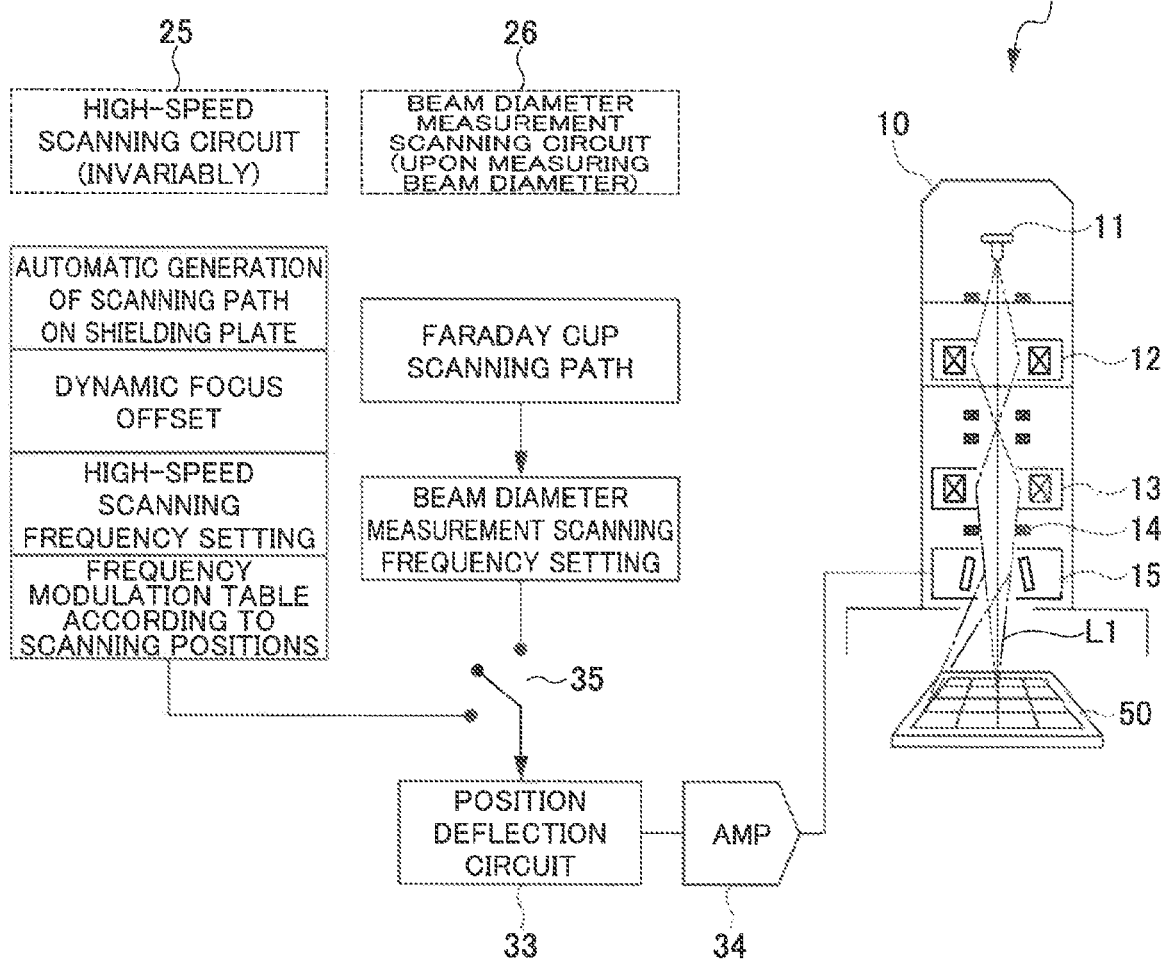
FIG. 3 is an explanatory diagram illustrating a high-speed scanning circuit and a beam diameter measurement scanning circuit in the three-dimensional PBF-AM apparatus according to the first embodiment of the present invention.

FIG. 3 is an explanatory diagram illustrating configurations of the high-speed scanning circuit 25 and the beam diameter measurement scanning circuit 26. As illustrated in FIG. 3, the high-speed scanning circuit 25 and the beam diameter measurement scanning circuit 26 are connected to the position deflection circuit 33 via the changeover switch 35.

The high-speed scanning circuit 25 generates a scanning path so as not to concentrate the electron beam L1 in one place and so as to scan the electron beam L1 on the shielding plate 55 at a high speed (automatic generation of the scanning path on the shielding plate). In addition, in order to weaken an irradiation intensity of the electron beam L1, the high-speed scanning circuit 25 defocuses the electron beam L1 (dynamic focus offset). Furthermore, the high-speed scanning circuit 25 has a modulation table of frequencies of the electron beam L1 according to scanning positions and sets a frequency of the electron beam L1 based on this modulation table (high-speed frequency setting).

The beam diameter measurement scanning circuit 26 sets a Faraday cup scanning path and a beam diameter measurement scanning frequency. The Faraday cup scanning path is set in accordance with positions of the plurality of passing holes 53 provided for the knife edge 52 of the detection part 50.

The changeover switch 35 switches a circuit connected to the position deflection circuit 33 between the high-speed scanning circuit 25 and the beam diameter measurement scanning circuit 26 in accordance with beam adjustment processing information outputted from the adjustment part 21.

1-2. Example of Beam Adjustment Work

Next, an example of beam adjustment work in the three-dimensional PBF-AM apparatus 100 having the above-described configuration will be described with reference to FIGS. 4 to 7.

Figure 4:
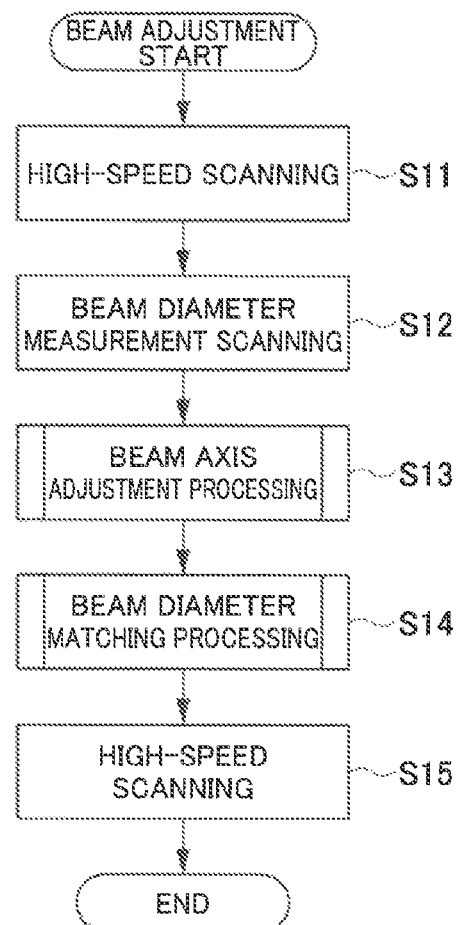
FIG. 4 is a flowchart showing an operation example of beam adjustment work in the three-dimensional PBF-AM apparatus according to the first embodiment of the present invention.
Figure 6A:
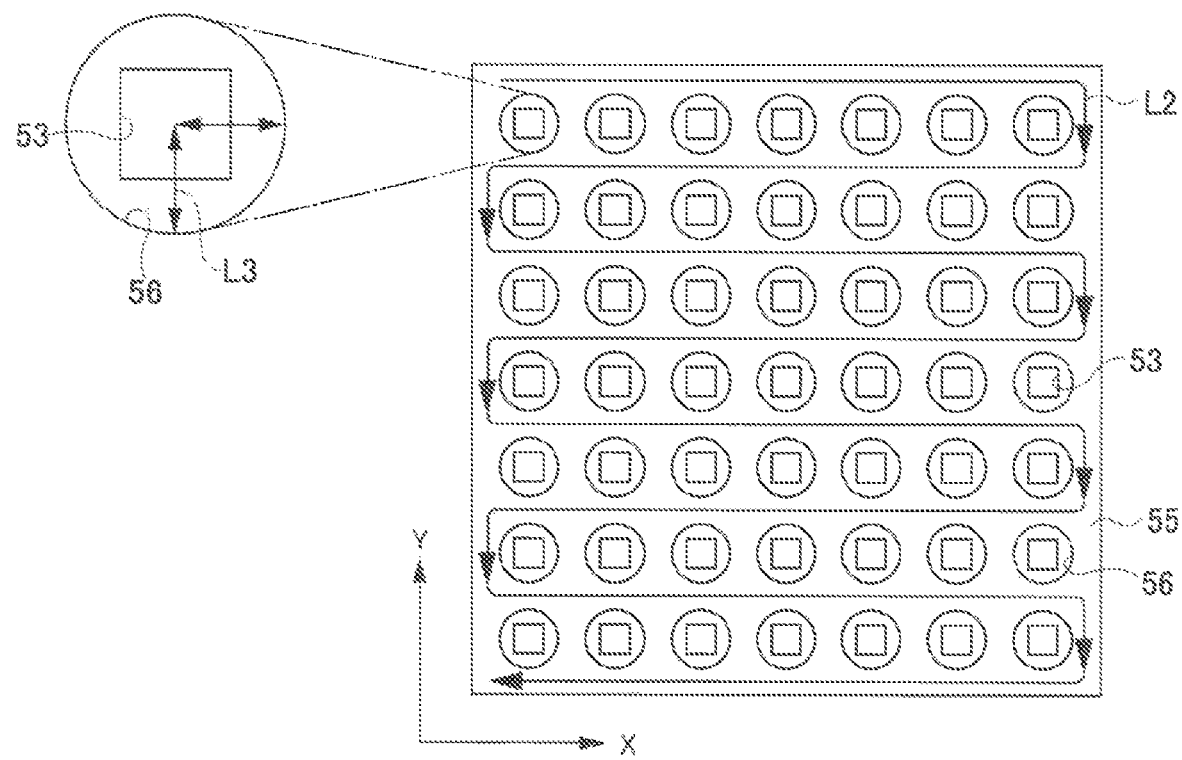
FIGS. 6A and 6B are explanatory diagrams showing scanning examples in the three-dimensional PBF-AM apparatus according to the first embodiment of the present invention.
Figure 6B:
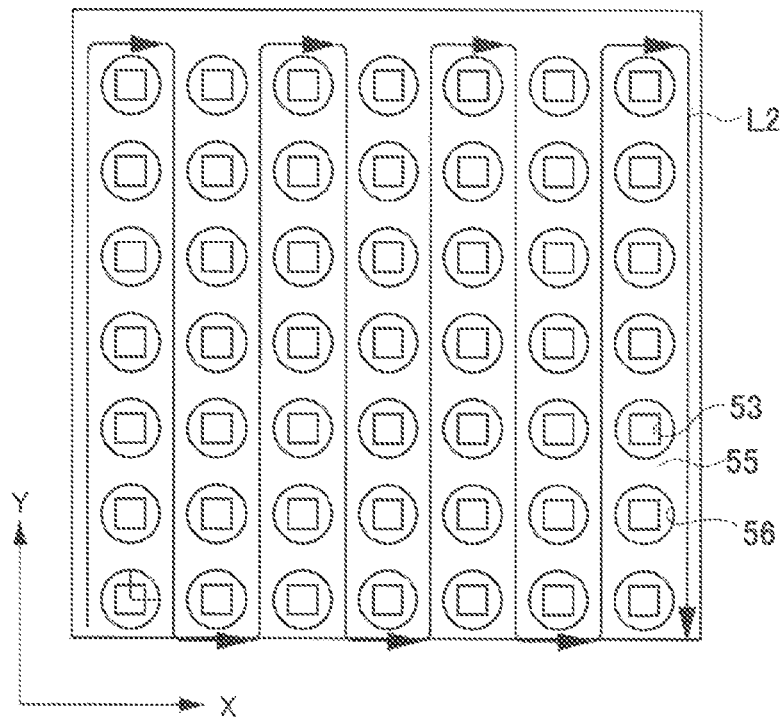

FIG. 4 is a flowchart showing an operation example of the beam adjustment work and FIG. 5 is an explanatory diagram showing the beam adjustment work. FIGS. 6A and 6B are explanatory diagrams showing a scanning example of the electron beam L1 upon the beam adjustment work.

First, when the beam adjustment processing is started, as illustrated in FIGS. 4 and 5, the adjustment part 21 performs high-speed scanning processing (normal processing) in which the electron beam L1 is scanned at a high speed (step S11). In the high-speed scanning processing shown in step S11, the adjustment part 21 operates the changeover switch 35 and connects the high-speed scanning circuit 25 to the position deflection circuit 33. In addition, the adjustment part 21 sets an emission current flowed to the electron gun 11 upon performing the high-speed scanning processing. As described above, by setting the emission current upon performing the high-speed scanning processing, upon performing the later-described beam diameter measurement scanning processing, the beam diameter measurement scanning processing can be implemented at once without setting the emission current.

In the high-speed scanning processing, as shown in FIGS. 6A and 6B, the electron beam L1 is scanned along a scanning line L2 on the shielding plate 55. In other words, the electron beam L1 is shielded by the shielding plate 55 and is not radiated to the detection part 50. Thus, the detection part 50 can be prevented from being deformed by heat generated by the electron beam L1 and positions of the passing holes 53 provided for the knife edge 52 can be prevented from being changed. As a result, the beam diameter and the irradiation position of the beam can be accurately measured.

In addition, the high-speed scanning circuit 25 causes the electron beam L1 to be invariably scanned on the shielding plate 55 without causing the electron beam L1 to stay in one place. Thus, damaging the shielding plate 55, which is caused by concentrating the electron beam L1 in one place, can be prevented. Furthermore, a focus of the electron beam L1 is widened by the high-speed scanning circuit 25. Thus, the irradiation intensity of the electron beam L1 can be reduced and a temperature of the shielding plate 55 can be prevented from being increased.

Next, upon completing the setting of the emission current, the adjustment part 21 performs the beam diameter measurement scanning processing in which a beam diameter of the electron beam L1 is measured (step S12). In the beam diameter measurement scanning processing shown in step S12, the adjustment part 21 operates the changeover switch 35 and connects the beam diameter measurement scanning circuit 26 to the position deflection circuit 33.

In the beam diameter measurement scanning processing, the electron beam L1 passes through the opening holes 56 of the shielding plate 55 and is radiated to the knife edge 52 and the Faraday cup 51 of the detection part 50. In addition, as shown in FIGS. 5 and 6A, the electron beam L1 is scanned from an edge portion which is in parallel with the first direction X or the second direction Y in the passing holes 53 of the knife edge 52 along (scanning) L3 in the first direction X or the second direction Y. The adjustment part 21 measures a current value of the Faraday cup 51, thereby measuring the beam diameter of the electron beam L1.

Next, with reference to FIGS. 7A and 7B, a method of measuring the beam diameter will be described. FIGS. 7A and 7B are explanatory diagrams showing a method of measuring the beam diameter, FIG. 7A shows a beam profile and a current value measured by the current value measurement part 62, and FIG. 7B shows differential data in FIG. 7A.

As shown in FIGS. 7A and 7B, the position deflection circuit 33 controls the deflection amplifier 15 based on the Faraday cup scanning path outputted from the beam diameter measurement scanning circuit 26, and the electron beam L1 is scanned from the edge portion of the passing holes 53 of the knife edge 52 toward the Faraday cup 51 or from the Faraday cup 51 toward the edge portion of the passing holes 53 of the knife edge 52.

As shown in FIG. 7A, when the electron beam L1 is radiated to the Faraday cup 51, a current value is increased, and when the electron beam L1 is radiated to the knife edge 52, the current value is decreased. In the adjustment part 21, the current value measured by the current value measurement part 62 is differentiated. Thus, the differential data shown in FIG. 7B can be calculated. The adjustment part 21 calculates a full width at half maximum (FWHM: Full Width at Half Maximum) of the differential data shown in FIG. 7B as the beam diameter of the electron beam L1 and stores the full width at half maximum in a storage part, which is not illustrated.

Upon completing the measurement scanning of the beam diameter for the passing holes 53, the adjustment part 21 performs beam axis adjustment processing in which a focus (focus), astigmatism, and distortion (positional displacement) of the electron beam L1 are adjusted (step S13). Next, the adjustment part 21 performs beam diameter matching processing in which sizes of the beam diameters of the passing holes 53 in positions (irradiation positions) are matched to one another (step S14). Note that the beam axis adjustment processing shown in step S13 and the beam diameter matching processing shown in step S14 will be described later.

Upon completing the beam diameter matching processing, the adjustment part 21 performs the high-speed scanning processing in which the electron beam L1 is scanned at the high speed (step S15). In other words, the adjustment part 21 operates the changeover switch 35 and connects the high-speed scanning circuit 25 to the position deflection circuit 33. In addition, the adjustment part 21 turns off the emission current flowed to the electron gun 11 upon performing the high-speed scanning processing. Thus, the beam adjustment work in the three-dimensional PBF-AM apparatus 100 is completed.

1-3. Beam Axis Adjustment Processing

Next, with reference to FIGS. 8 to 14B, the beam axis adjustment processing will be described.

FIG. 8 is a flowchart showing the beam axis adjustment processing.

As shown in FIG. 8, First, the adjustment part 21 determines whether or not measurement of all places of the Faraday cup 51 is completed (step S21). Here, all places of the Faraday cup 51 are places where the plurality of passing holes 53 of the knife edge 52 are formed. When it is determined in processing in step S21 that the measurement of all places of the Faraday cup 51 is not completed (NO determination in step S21), the adjustment part 21 measures an optimum focus Fx in the first direction X (step S22). Next, the adjustment part 21 measures an optimum focus Fy in the second direction Y (step S23).

FIGS. 9A to 10B are explanatory diagrams showing optimum focus correction processing.

Figure 9A:
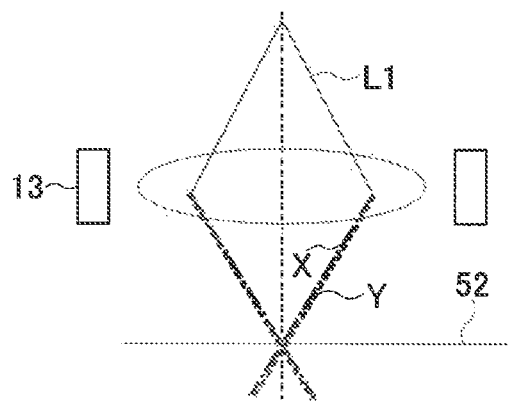
FIGS. 9A and 9B show focus correction processing in the three-dimensional PBF-AM apparatus according to the first embodiment of the present invention and shows a state in which a difference between focuses in a first direction and a second direction is within an allowable value.
Figure 9B:
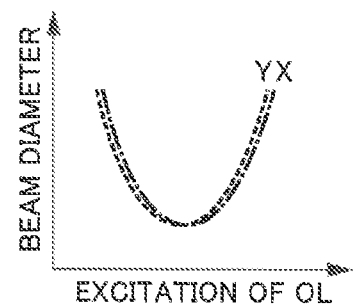
Figure 10A:
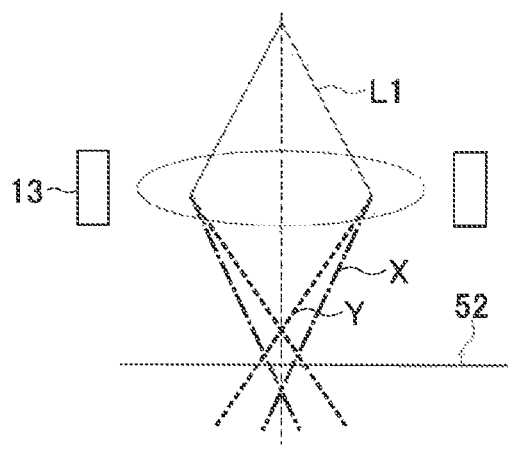
FIGS. 10A and 10B show focus correction processing in the three-dimensional PBF-AM apparatus according to the first embodiment of the present invention and shows a state in which the difference between the focuses in the first direction and the second direction exceeds the allowable value.
Figure 10B:
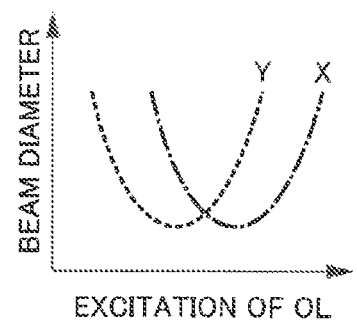

FIGS. 9A and 9B show a state in which a difference between the focus (hereinafter, referred to as a first focus) Fx in the first direction X and the focus (hereinafter, referred to as a second focus) Fy in the second direction Y is within an allowable value and FIGS. 10A and 10B show a state in which each of the first focus Fx and the second focus Fy exceeds the allowable value. In addition, FIGS. 9A and 10A are explanatory diagrams illustrating the electron beam L1 radiated to the detection part 50 and FIGS. 9B and 10B are graphs each showing a relationship between the beam diameter and the excitation current of the objective lens 13.

As shown in FIGS. 9A and 10A, the focus correction part 22 of the adjustment part 21 changes the excitation current to the objective lens 13 and changes the beam diameter on the build surface 4a (knife edge 52). As shown in FIGS. 9B and 10B, the focus correction part 22 sets positions, in which beam diameters are minimum, as optimum focuses in the respective directions.

Next, the adjustment part 21 determines whether or not the difference between the first focus Fx and the second focus Fy exceeds an astigmatism allowable value (step S24). As shown in FIGS. 10A and 10B, when the first focus Fx and the second focus Fy are displaced, in the processing in step S24, the difference between the first focus Fx and the second focus Fy exceeds the astigmatism allowable value (NO determination in step S24).

When in the processing in step S24, the NO determination is made, an excitation current flowed to the coil 14 for the astigmatism correction by the astigmatism correction part 23 of the adjustment part 21 is adjusted, and measurement and correction of astigmatism (aberration) X in the first direction X are conducted (step S25). In addition, the excitation current flowed to the coil 14 for the astigmatism correction is adjusted by the astigmatism correction part 23, and measurement and correction of astigmatism (aberration) Y in the second direction Y are conducted (step S26).

FIGS. 11A and 11B are explanatory diagrams showing the astigmatism correction processing. FIG. 11A shows measurement and correction processing of the astigmatism X in the first direction X and FIG. 11B shows measurement and adjustment processing of the astigmatism Y in the second direction Y.

In the processing in step S25, as shown in FIG. 11A, the astigmatism correction part 23 changes the astigmatism X in the first direction X and obtains the astigmatism X which makes edge sharpness of the first direction X and the second direction Y minimum. This completes the measurement and correction work of the astigmatism X. In addition, in the processing in step S26, as shown in FIG. 11B, the astigmatism correction part 23 changes the astigmatism Y in the second direction Y and obtains the astigmatism Y which makes edge sharpness of the first direction X and the second direction Y minimum. This completes the measurement and correction work of the astigmatism Y.

Upon completing the processing in step S26, the adjustment part 21 returns to the processing in step S22 again, performs the processing in step S22 and the processing in step S23, and measures an optimum first focus Fx and an optimum second focus Fy. In the processing in step S24, a difference between the first focus Fx and the second focus Fy is determined.

Figure 12A:
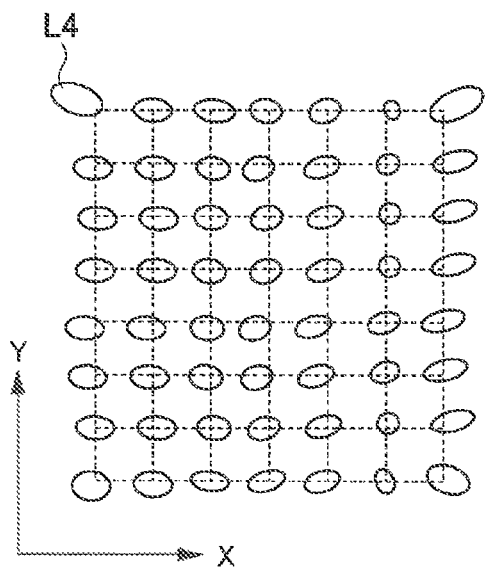
FIGS. 12A and 12B show states before and after the correction processing of the focus and astigmatism in the three-dimensional PBF-AM apparatus according to the first embodiment of the present invention.
Figure 12B:
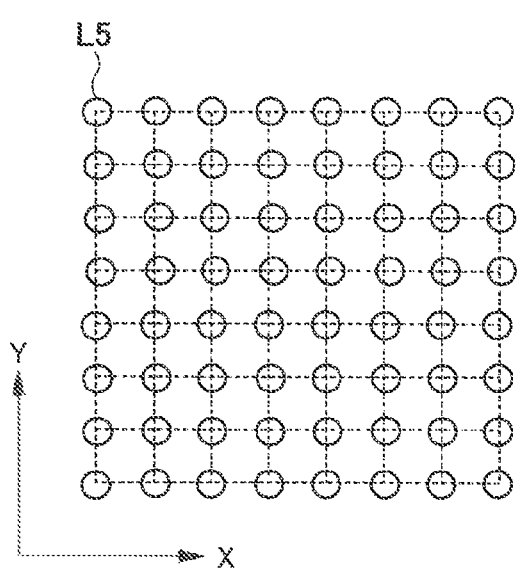

FIGS. 12A and 12B are explanatory diagrams showing focuses and states before and after the astigmatism correction processing. FIG. 12A shows the state before the correction and FIG. 12B shows the state after the correction.

As shown in FIG. 12A, irradiation spots L4 of the electron beam L1 which are obliquely deformed can be corrected by repeating the above-described processing in step S22 to step S26 for the plurality of passing holes 53 as the irradiation positions of the electron beam L1 in such a way as to form substantially circular shapes of irradiation spots L5 as shown in FIG. 12B. Note that the adjustment part 21 stores the beam diameter of each of the irradiation positions and focus value characteristics in the storage part.

When in the processing in step S24, it is determined that the difference between the first focus Fx and the second focus Fy does not exceed the astigmatism allowable value (YES determination step S24), the correction processing of the focuses and the astigmatism is completed. Next, the adjustment part 21 measures and corrects distortion X which is the displacement of each of the irradiation positions of the electron beam L1 in the first direction X (step S27). The adjustment part 21 measures and corrects distortion Y which is the displacement of each of the irradiation positions of the electron beam L1 in the second direction Y (step S28).

Figure 13:
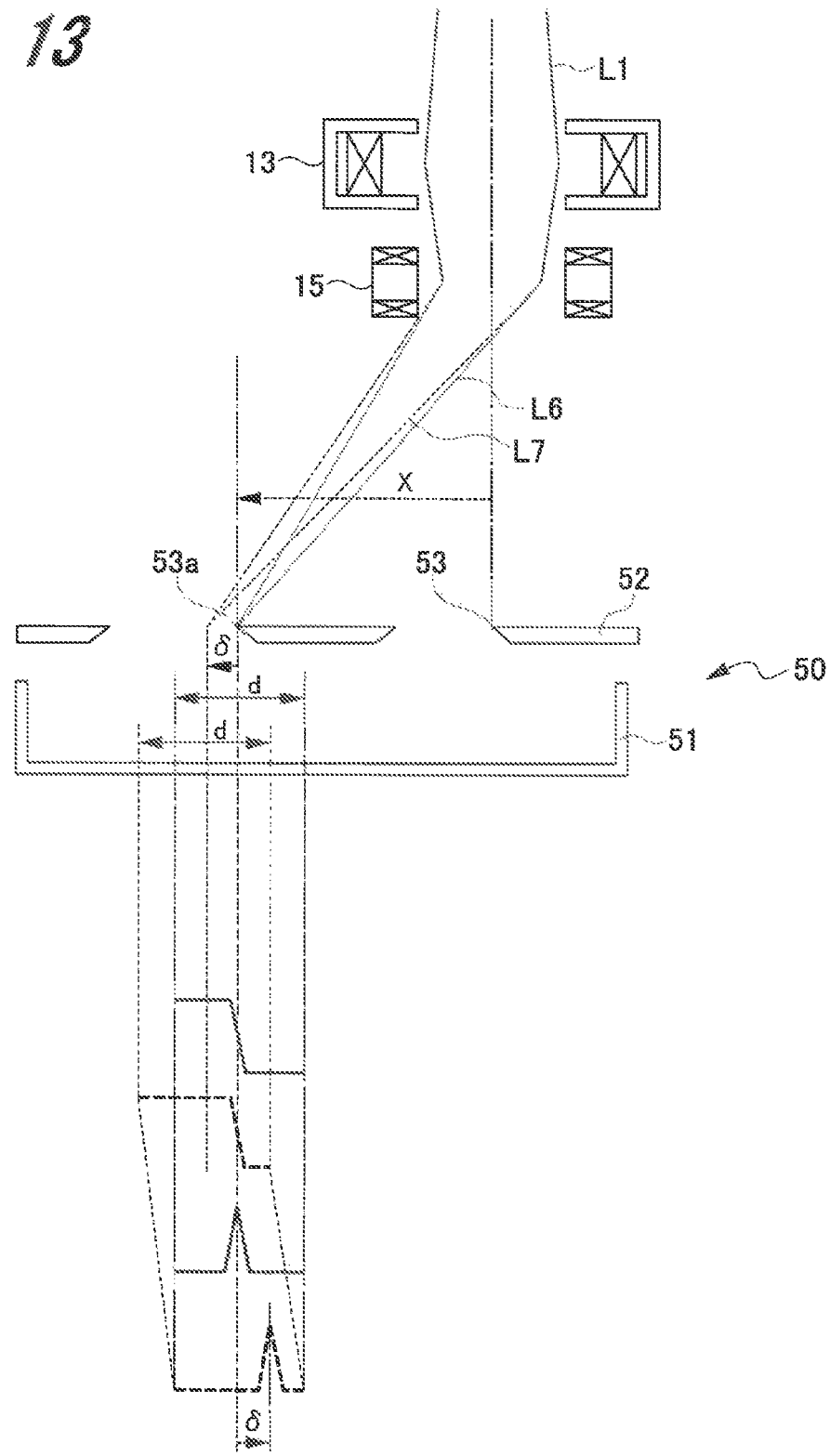
FIG. 13 is an explanatory diagram showing measurement processing of positional displacement of the electron beam in the three-dimensional PBF-AM apparatus according to the first embodiment of the present invention.

FIG. 13 is an explanatory diagram showing measurement processing of the distortion X (positional displacement).

As shown in FIG. 13, the beam diameter measurement scanning circuit 26 controls the deflection amplifier 15 via the position deflection circuit 33 and deflects the electron beam L1 from an edge portion 53a of each of the passing holes 53 of the knife edge 52 to an edge portion 53a of each of the passing holes 53 which neighbors thereto. Here, an interval between the passing holes 53 is set to a length x. Therefore, a length of deflection of the electron beam L1 is a length x. The beam diameter measurement scanning circuit 26 causes the electron beam L1 to be scanned along the first direction X with a predetermined width d.

At this time, when the deflection distortion (positional displacement) is not caused, as indicated by a solid line L6, the electron beam L1 is scanned from the edge portion 53a of each of the passing holes 53 along the first direction X. A peak of the differential data of the current values measured by using the Faraday cup 51 is positioned at a center of the scanning width d.

In contrast to this, when the deflection distortion (positional displacement) δ is caused, as indicated by a dotted line L7, the electron beam L1 is deflected to a position which is separated from the edge portion 53a of each of the passing holes 53 by deflection distortion δ in the first direction X (x+δ). In this state, when the electron beam L1 is scanned along the first direction X with the predetermined width d, the peak of the differential data of the current values measured by using the Faraday cup 51 is displaced from the center of the scanning width d by deflection distortion δ. The position correction part 24 measures the deflection distortion δ (distortion X) from the position of the peak of the differential data and performs the correction. Note that since measurement processing of the distortion Y is similar thereto, the description therefor is omitted.

Figure 14A:
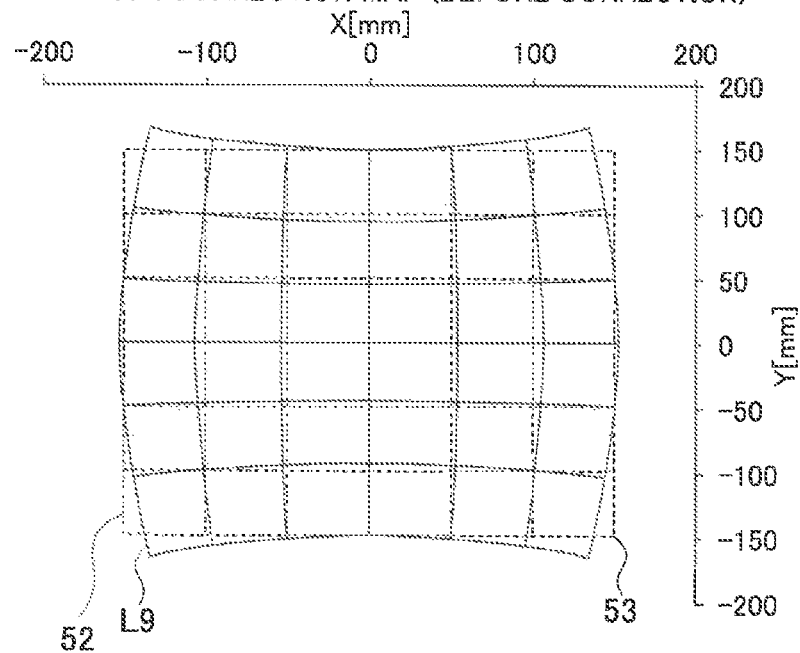
FIGS. 14A and 14B show distortion correction maps in the three-dimensional PBF-AM apparatus according to the first embodiment of the present invention.
Figure 14B:
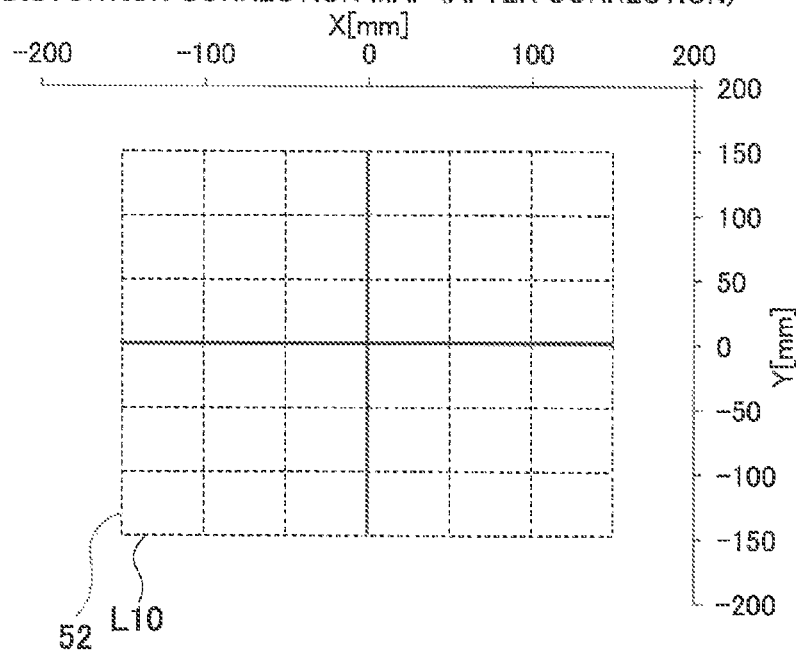

FIGS. 14A and 14B show distortion correction maps, FIG. 14A shows the map before the correction, and FIG. 14B shows the map after the correction.

As shown in FIG. 14A, in the state before the correction, an irradiation position L9 of the electron beam L1 is displaced from the position of each of the passing holes 53 of the knife edge 52 which is the detection part 50. By performing the distortion correction, as shown in FIG. 14B, an irradiation position L10 of the electron beam L1 matches a position of each of the passing holes 53 of the knife edge 52.

As shown in FIG. 8, upon completing the measurement of the distortion X and the distortion Y and the correction processing, the processing returns to step S21. When it is determined that the measurement of all places of the Faraday cup 51 is completed (YES determination in step S21), the adjustment part 21 prepares a build scanning dynamic focus correction map (step S29). In other words, the adjustment part 21 prepares a focus correction map in which correction amounts and beam diameters of focuses of the irradiation positions of the electron beam L1 are stored.

Next, the adjustment part 21 prepares a build surface dynamic astigmatism correction map (step S30). In other words, the adjustment part 21 prepares the astigmatism correction map in which astigmatism correction amounts of the irradiation positions of the electron beam L1 are stored.

Next, the adjustment part 21 prepares a build surface distortion correction map (step S31). In other words, the adjustment part 21 prepares the correction map shown in FIG. 14B. This finishes the beam axis adjustment processing.

1-4. Beam Diameter Matching Processing

Next, with reference to FIG. 15, the beam diameter matching processing will be described.

FIG. 15 is a flowchart showing the beam diameter matching processing.

As shown in FIG. 15, first, the adjustment part 21 determines whether or not the measurement of all places of the Faraday cup 51 is completed (step S41). When in the processing in step S41, it is determined that the measurement of all places of the Faraday cup 51 is not completed (NO determination in step S41), the adjustment part 21 scans the electron beam L1 in the first direction X and measures a beam diameter in the first direction X (hereinafter, referred to as a first beam diameter) Dnx (step S42). Next, the adjustment part 21 scans the electron beam L1 in the second direction Y and measures a beam diameter in the second direction Y (hereinafter, referred to as second beam diameter) Dny (step S43).

In addition, the adjustment part 21 calculates a beam diameter Dn of each of the irradiation positions from the first beam diameter Dnx and the second beam diameter Dny (step S44). Upon finishing the calculation processing of the beam diameter Dn, the processing returns to step S41.

Next, when it is determined that the measurement processing of the beam diameter Dn in each of all places is completed (YES determination in step S41), the adjustment part 21 determines a maximum beam diameter D0 to the build surface (step S45). The adjustment part 21 determines whether or not adjustment in all places of the Faraday cup 51 is completed (step S46). The adjustment in all places of the Faraday cup 51 in the processing in step S46 is adjustment of beam diameters in a plurality of irradiation positions.

When in the processing in step S46, it is determined that the adjustment in all places is not completed (NO determination in step S46), the adjustment part 21 makes a focus offset in each of the irradiation positions (step S47). Here, in the beam axis adjustment processing, the focus correction map and the astigmatism correction map in the irradiation positions are prepared. Therefore, focus adjustment amounts can be seen from the focus correction map and the astigmatism correction map to obtain desired beam diameters in the irradiation positions. Thus, the focus offset in the processing in step S47 can be easily made.

After making the focus offset, the adjustment part 21 measures the first beam diameter Dnx by scanning the electron beam L1 in the first direction X (step S48). Next, the adjustment part 21 measures the second beam diameter Dny by scanning the electron beam L1 in the second direction Y (step S49). The adjustment part 21 calculates the beam diameter Dn in each of the irradiation positions from the first beam diameter Dnx and the second beam diameter Dny (step S50).

Next, the adjustment part 21 determines whether or not a difference between the beam diameter Dn and the maximum beam diameter D0 in each of the irradiation positions is equal to or less than an allowable value (step S51). When in the processing in step S51, it is determined that the difference between the beam diameter Dn and the maximum beam diameter D0 exceeds the allowable value (NO determination in step S51), the processing returns to step S47 again and the focus offset is made.

In contrast to this, when in the processing in step S51, it is determined that the difference between the beam diameter Dn and the maximum beam diameter D0 does not exceed the allowable value (YES determination in step S51), the adjustment part 21 records the focus offset set in the processing in step S47 (step S52). The adjustment part 21 returns to the processing in step S46.

In addition, when in the processing in step S46, it is determined that the adjustment in all places is completed (YES determination in step S46), the adjustment part 21 prepares a build surface beam diameter matching focus offset map (step S53). The focus offset map shows a focus offset in each of the irradiation positions recorded in the processing in step S52. This finishes the beam diameter matching processing.

Here, if beam diameters are different from one another, energy densities of the electron beam L1 radiated to the build surface 4a and degrees at which the formed powder material is melted are changed, thereby degrading quality of a modeled object. In contrast to this, by performing the beam adjustment work in the present embodiment, beam diameters in all areas of the build surface 4a of the three-dimensional PBF-AM apparatus 100 which are substantially even can be adjusted. As a result, the energy densities of the electron beam L1 in all areas of the build surface 4a can also be made even, thereby allowing a modeled object having the same quality to be made.

2. Second Embodiment

Next, with reference to FIG. 16, a beam adjustment method according to a second embodiment will be described.

Figure 16:
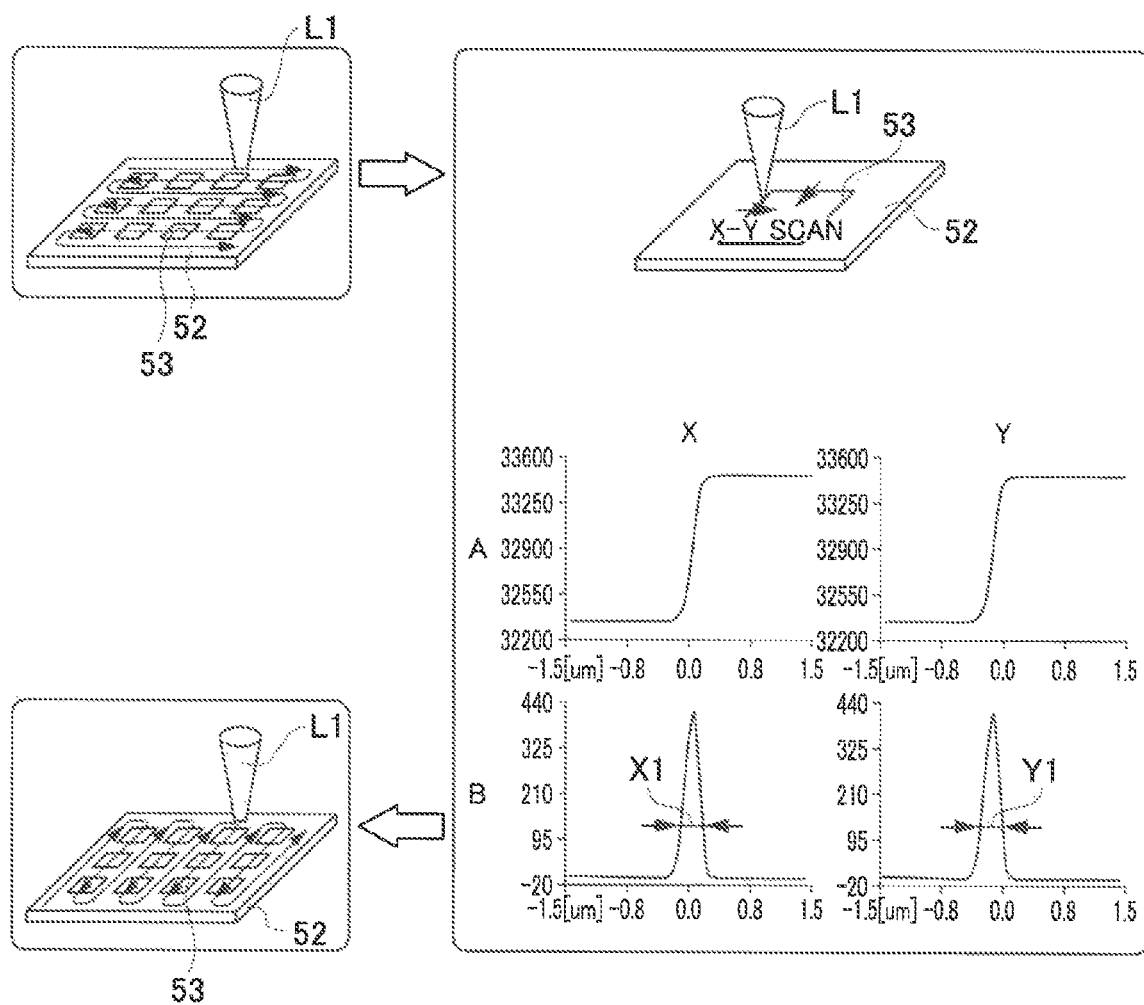
FIG. 16 is an explanatory diagram showing beam adjustment work in a PBF-AM apparatus according to a second embodiment of the present invention.

FIG. 16 is an explanatory diagram showing the beam adjustment method according to the second embodiment.

The beam adjustment method according to the second embodiment is different from the beam adjustment method according to the first embodiment in that beam adjustment work is performed without providing a shielding plate 55 for an adjustment unit. Therefore, parts which are in common with those in the beam adjustment method and the three-dimensional PBF-AM apparatus according to the first embodiment are denoted by the same reference signs and overlapping description is omitted.

As shown in FIG. 16, in the beam adjustment method according to the second embodiment, upon starting beam adjustment processing, an adjustment part 21 performs high-speed scanning processing (normal processing) in which an electron beam L1 is scanned at a high speed. In the high-speed scanning processing, without causing the electron beam L1 to stay in one place, the electron beam L1 is invariably scanned on a knife edge 52. Thus, damaging a detection part 50, which is caused by concentrating the electron beam L1 in one place, can be prevented.

In addition, upon performing the normal processing, a focus of the electron beam L1 is widened by a high-speed scanning circuit 25, that is, the electron beam L1 is defocused. Thus, an irradiation intensity of the electron beam L1 can be reduced and a temperature of the knife edge 52 can be prevented from being increased.

In addition, the adjustment part 21 sets an emission current flowed to the electron gun 11 upon performing the high-speed scanning processing. As described above, by setting the emission current upon performing the high-speed scanning processing, upon performing the later-described beam diameter measurement scanning processing, the beam diameter measurement scanning processing can be implemented at once without setting the emission current.

Next, upon completing the setting of the emission current, the adjustment part 21 performs the beam diameter measurement scanning processing in which a beam diameter of the electron beam L1 is measured. In the beam diameter measurement scanning processing, as with the beam adjustment work according to the first embodiment, the adjustment part 21 operates a changeover switch 35 and connects a beam diameter measurement scanning circuit 26 to a position deflection circuit 33.

In the beam diameter measurement scanning processing, the electron beam L1 is scanned from an edge portion which is in parallel with a first direction X or a second direction Y in passing holes 53 of the knife edge 52 along (scanning) L3 in the first direction X or the second direction Y. The adjustment part 21 measures a current value of a Faraday cup 51, thereby measuring the beam diameter of the electron beam L1 and performs beam axis adjustment processing and beam diameter matching processing. Note that since a method of measuring the beam diameter, the beam axis adjustment processing, and the beam diameter matching processing are the same as those in the beam adjustment method according to the first embodiment, the description therefor is omitted.

Upon completing each adjustment processing for the electron beam L1, the adjustment part 21 performs high-speed scanning processing in which the electron beam L1 is defocused and is scanned on the knife edge 52 at a high speed. Thus, the beam adjustment method according to the second embodiment is completed.

Since the other configuration of the beam adjustment method according to the second embodiment is the same as that of the three-dimensional PBF-AM apparatus 100 and the beam adjustment method according to the first embodiment, the description therefor is omitted. Also by employing the above-described beam adjustment method, operation and effect which are similar to those obtained by employing the beam adjustment method according to the above-described first embodiment can be obtained.

Note that the present invention is not limited to the embodiments described above and illustrated and shown in the drawings and a variety of modifications can be implemented without departing from the scope of the invention set forth in claims.

Note that although in the present specification, the words "in parallel with", "orthogonal to", and the like are used, these do not mean only strict "in parallel with" and "orthogonal to" and include words "in parallel with" and "orthogonal to" and further, may be "substantially in parallel with" and "substantially orthogonal to" which reside in a range in which functions thereof can be exhibited.

Note that although in the present specification, the words "in parallel with", "orthogonal to", and the like are used, these do not mean only strict "in parallel with" and "orthogonal to" and include words "in parallel with" and "orthogonal to" and further, may be "substantially in parallel with" and "substantially orthogonal to" which reside in a range in which functions thereof can be exhibited.

What is claimed is:

1. A method, comprising:
    radiating, from an electron gun, an electron beam onto an irradiation surface;
    installing, on the irradiation surface to which the electron beam is radiated, a detection part having a Faraday cup, the Faraday cup configured to catch electrical charges of the electron beam;
    installing, on a side of the electron gun further than the detection part, a shielding plate having a plurality of opening holes through which the electron beam is passable;
    installing a knife edge between the shielding plate and the Faraday cup, wherein the knife edge covers an opening of the Faraday cup, wherein the knife edge comprises a plurality of passing holes through which the electron beam is passible, wherein each of the plurality of opening holes is formed in a position facing the plurality of passing holes, and wherein a size of an opening of each of the plurality of opening holes is set to be larger than a size of an opening of each of the plurality of passing holes;
    performing a beam diameter measurement processing in which a beam diameter of the electron beam is measured, the beam diameter measurement processing comprising:
        passing the electron beam through the plurality of opening holes, and
        radiating the electron beam to the Faraday cup; and
    performing a normal processing in which the beam diameter of the electron beam is not measured, the normal processing comprising:
        scanning with the electron beam on the shielding plate.

2. The method according to claim 1, wherein the normal processing further comprises:
    defocusing the electron beam being radiated to the shielding plate.

3. The method according to claim 1, wherein the normal processing further comprises:
    setting an emission current being flowed to the electron gun.

4. The method according to claim 1, wherein the beam diameter measurement processing further comprises:
    measuring a current value of the Faraday cup, and
    measuring a beam diameter of the electron beam from the current value of the Faraday cup.

5. The method according to claim 4, further comprising:
    adjusting, based on the beam diameter, a focus of the electron beam.

6. The method according to claim 5, further comprising:
    adjusting, based on the beam diameter, an astigmatism of the electron beam.

7. The method according to claim 6, further comprising:
    measuring an irradiation position of the electron beam; and
    adjusting, based on the current value of the Faraday cup, the irradiation position of the electron beam.

8. The method according to claim 4, further comprising:
    radiating the electron beam to a plurality of places of the Faraday cup; and
    preparing a focus map in which a plurality of focus adjustment amounts and a plurality of beam diameters in a plurality of irradiation positions of the electron beam are stored.

9. The method according to claim 8, further comprising:
    performing a beam diameter matching processing, the beam diameter matching process comprising:

matching, based on the focus map and the plurality of beam diameters, a size of a first beam diameter of the plurality of beam diameters in a first irradiation position of the plurality of irradiation positions of the electron beam to one another beam diameter of the plurality of beam diameters in another irradiation position of the plurality of irradiation positions of the electron beam.

10. A method, comprising:

radiating, from an electron gun, an electron beam onto an irradiation surface;

installing, on the irradiation surface to which the electron beam is radiated, a detection part comprising a Faraday cup, the detection part configured to catch electrical charges of the electron beam;

installing a knife edge which covers an opening of the Faraday cup and has a plurality of passing holes through which the electron beam is passible;

performing a beam diameter measurement processing in which a beam diameter of the electron beam is measured, the beam diameter measurement processing comprising:
   scanning the electron beam on the plurality of passing holes of the knife edge at a first speed; and
   measuring the beam diameter of the electron beam; and performing a normal processing in which the beam diameter of the electron beam is not measured, the normal processing comprising:

scanning the electron beam on the knife edge at a second speed which is higher than the first speed.

* * * * *